(12) United States Patent
Bart et al.

(10) Patent No.: US 12,068,430 B2
(45) Date of Patent: Aug. 20, 2024

(54) SYSTEM AND METHOD FOR REPAIRING VACANCIES RESULTING FROM MASS TRANSFER OF DEVICES

(71) Applicant: Palo Alto Research Center Incorporated, Palo Alto, CA (US)

(72) Inventors: Evgeniy Bart, Santa Clara, CA (US); Yunda Wang, Milpitas, CA (US); Matthew Shreve, Mountain View, CA (US)

(73) Assignee: Xerox Corporation, Norwalk, CT (US)

( * ) Notice: Subject to any disclaimer, the term of this patent is extended or adjusted under 35 U.S.C. 154(b) by 622 days.

(21) Appl. No.: 17/234,173

(22) Filed: Apr. 19, 2021

(65) Prior Publication Data

US 2022/0336696 A1 Oct. 20, 2022

(51) Int. Cl.
*H01L 33/00* (2010.01)
*H01L 21/683* (2006.01)
*H01L 25/075* (2006.01)
*H01L 33/62* (2010.01)

(52) U.S. Cl.
CPC ...... *H01L 33/0095* (2013.01); *H01L 21/6835* (2013.01); *H01L 25/0753* (2013.01); *H01L 33/62* (2013.01); *H01L 2221/68354* (2013.01); *H01L 2221/68368* (2013.01); *H01L 2933/0066* (2013.01)

(58) Field of Classification Search
CPC ............. H01L 33/0095; H01L 21/6835; H01L 25/0753; H01L 33/62; H01L 2221/68354; H01L 2221/68368; H01L 2933/0066; H01L 2221/68322
See application file for complete search history.

(56) References Cited

U.S. PATENT DOCUMENTS 10,186,629 B2   1/2019   Forrest et al.
10,504,882 B2   12/2019  Rogers et al.

FOREIGN PATENT DOCUMENTS

KR          102095215          4/2020

*Primary Examiner* — Ratisha Mehta
(74) *Attorney, Agent, or Firm* — Mueting Raasch Group

(57) ABSTRACT

A method utilizes a target substrate has an array of chips on a carrier with a plurality of vacancies and a plurality of donor coupons are incompletely filled with functional chips. A bounding box is defined that encompasses the vacancies on the target substrate. Outcomes are simulated by overlapping a representation of the bounding box over a representation of each of a plurality of donor coupons at a plurality of translational offsets on a substrate plane to determine matches. An optimal one of the outcomes is found at a selected one or more of the donor coupons corresponding one or more offsets. A parallel transfer of the matching functional chips fills the vacancies on the target substrate using the one or more selected donor coupons and corresponding one or more offsets.

17 Claims, 11 Drawing Sheets

$$B = \begin{bmatrix} 1 & 0 & 0 & 0 & 0 & 0 \\ 0 & 0 & 1 & 0 & 0 & 1 \\ 0 & 0 & 0 & 0 & 0 & 0 \\ 0 & 0 & 1 & 0 & 0 & 0 \\ 0 & 0 & 0 & 0 & 0 & 0 \\ 0 & 1 & 0 & 0 & 1 & 0 \end{bmatrix}$$

→ vacancies [ ] = { (0,0) }, (3,0), (1,2), (5,4), (1,5) } — 1100
matches[9] = 0B11011 — 1102

$$D = \begin{bmatrix} 1 & 0 & 0 & 0 & 0 & 1 & 0 & 0 & 1 \\ 0 & 0 & 0 & 0 & 0 & 1 & 0 & 1 & 0 & 1 \\ 0 & 0 & 1 & 0 & 0 & 0 & 1 & 1 & 0 & 0 \\ 0 & 0 & 0 & 0 & 1 & 0 & 1 & 1 & 0 & 0 \\ 0 & 0 & 0 & 0 & 0 & 0 & 0 & 0 & 0 & 0 \\ 0 & 0 & 1 & 0 & 1 & 0 & 0 & 0 & 1 & 1 & 0 \\ 1 & 0 & 0 & 0 & 1 & 0 & 0 & 0 & 0 & 0 \\ 1 & 1 & 0 & 1 & 0 & 1 & 0 & 0 & 0 & 0 \\ 0 & 0 & 0 & 0 & 0 & 0 & 0 & 0 & 1 & 0 \\ 0 & 1 & 1 & 1 & 0 & 0 & 0 & 0 & 0 & 0 \end{bmatrix}$$

FIG. 11

SYSTEM AND METHOD FOR REPAIRING VACANCIES RESULTING FROM MASS TRANSFER OF DEVICES

SUMMARY

The present disclosure is directed to repairing vacancies resulting from mass transfer of devices. In one embodiment, a method involves identifying a target substrate comprising an array of chips on a carrier with a plurality of vacancies. A plurality of donor coupons that are incompletely filled with functional chips are also identified. A bounding box is defined that encompasses the vacancies on the target substrate. A plurality of outcomes are simulated by overlapping a representation of the bounding box over a representation of each of a plurality of donor coupons at a plurality of translational offsets on a substrate plane to determine matches between the vacancies of the target and the functional chips on the donor coupons. An optimal one of the outcomes is determined at a selected one or more of the donor coupons corresponding one or more offsets. A parallel transfer of the matching functional chips is performed to fill the vacancies on the target substrate using the one or more selected donor coupons and corresponding one or more offsets.

In another embodiment, a method involves identifying a target substrate comprising an array of chips on a carrier with a plurality of vacancies. A donor coupon is identified that is incompletely filled with functional chips. A bounding box is defined that encompasses the vacancies on the target substrate. A representation of the bounding box is overlapped over a representation of the donor coupons at a plurality of translational offsets on a substrate plane. For each of the offsets, existence of a match between the vacancies of the target and the functional chips on the donor coupon is determined. Based on finding the match, a parallel transfer of the matching functional chips fills the vacancies on the target substrate.

In another embodiment, a first data representation is formed of a target substrate having an array of chips on a carrier with a plurality of vacancies. A second data representation is formed of a plurality of donor coupons that are incompletely filled with functional chips. The plurality of donor coupons are incompletely filled due to any combination of non-functional chips and missing chips. The representations are abstracted into a current state description of the target substrate and the donor coupons. The current state description is input into a machine learning model that has been trained on previous mass transfer sequences. An optimal output of the machine learning model is determined, the optimal output defining at least a selected one or more of the donor coupons and corresponding functional chips used to fill the vacancies. A parallel transfer of the matching functional chips fills the vacancies on the target substrate using the selected donor coupon and corresponding functional chips.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

FIGS. 10 and 11 are diagrams showing the data representations of bounding boxes and donor substrates according to example embodiments.

DETAILED DESCRIPTION

Figure 2:
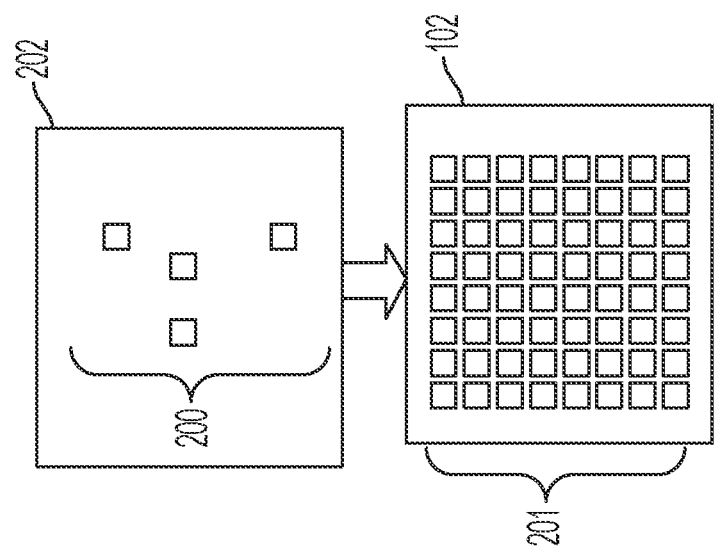
FIGS. 1 and 2 are block diagrams showing an assembly process according to an example embodiment.

The present disclosure relates to manipulation and assembly of objects, and in some embodiments the mass assembly of micro-objects from a donor substrate to a target substrate. Some electronic devices are fabricated by mechanically overlaying small objects on top of each other. While microelectronic and micro-optical components are sometimes manufactured using wafer formation techniques such as layer deposition, masking, and etching, certain classes of materials are not growth-compatible with each other. In such a case, the assembly may involve forming one class of devices on a first, donor, substrate and a second class of devices on a second, target, substrate, and then mechanically joining them, e.g., via flip-chip or transfer printing techniques.

The physical transfer of micro-objects chips, one by one, from the source wafer to the target device is a mechanical operation that can be quite time consuming for devices with millions of individual chiplets. A promising technology in such cases is "mass transfer", where a block (e.g., 100×100 chips or 500×500 chips) is transferred at once from the source wafer to the target device. Aspects described herein relate to a system that is capable of transferring large number of micro objects (e.g., particles/chiplets/mini- or micro-LED dies) from a donor substrate to another substrate in parallel while maintaining high position registration of the individual micro objects. This system allows selectively transferring of micro objects from a transfer substrate and selectively place the micro objects to the destination or target substrate. This system may be used for assembling devices such as microLED displays.

Generally, microLED displays are made with arrays of microscopic LEDs forming the individual transfer elements. Along with OLEDs, microLEDs are primarily aimed at small, low-energy mobile devices. Both OLED and microLED offer greatly reduced energy requirements compared to conventional LCD systems. Unlike OLED, microLED is based on conventional GaN LED technology, which offers higher total brightness than OLED produces, as well as higher efficiency in terms of light emitted per unit of power. It also does not suffer from the shorter lifetimes of OLED.

A single 4K television utilizing microLED has ~25 million small LED subpixels that then need to be assembled. Mass transfer of chiplets is one technology that may be used for microLED manufacturing. Transferring microLED to a target backplane quickly and accurately with a high yield will enable microLED to be a viable mass-market product. The techniques described below can be used for microLED manufacture, as well as other assembly procedures in which a large number of (typically) small objects need to be moved at once, and where it may be necessary to selectively move a subset of such device to and/or from the transfer media. Such micro objects may include but not limited to inks, pre-deposited metal films, silicon chips, integrated circuit chips, beads, microLED dies, micro-electro-mechanical system (MEMS) structures, and any other pre-fabricated micro structures.

Being able to selectively transfer chiplets in an arbitrary pattern is useful to facilitate the effective transfer process, pixel repair, hole/vacancy refill for microLED display manufacturing, which will lead to high process yield. An elastomer stamp has been used to deterministically transfer microscale LED chips for this type of application. However, an elastomer stamp has fixed pattern and cannot transfer arbitrary pattern of chiplets. Inevitably, some subset of the chiplets will be defective, and therefore it becomes difficult to replace a select few of them using such a stamp.

Figure 1:
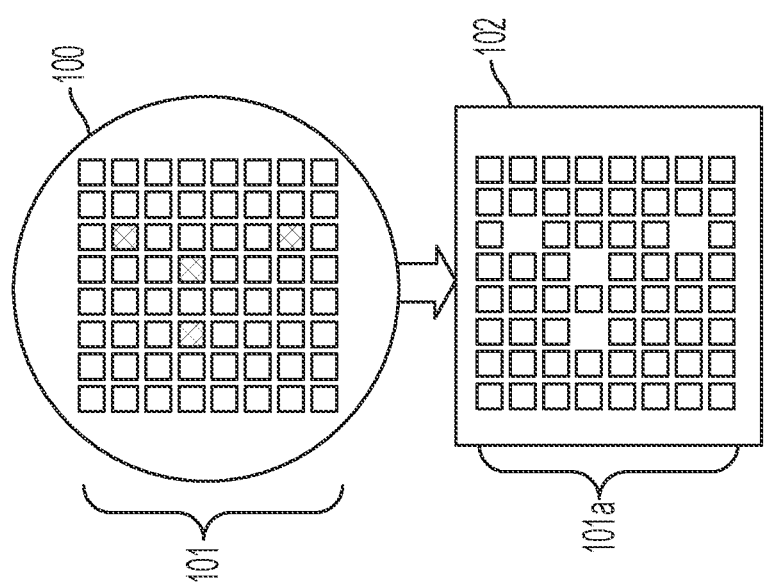

In FIGS. 1 and 2, block diagrams show an example of an assembly process that can be achieved using devices, systems, and methods according to an example embodiment. In FIG. 1, a donor wafer/substrate 100 is shown that includes an array of chiplets 101 that may have been grown or placed on the substrate 100. The shaded chiplets in the array 101 have been identified as defective, and when the chiplets are transferred to a target substrate 102, only a subset 101a of the chiplet array are transferred, namely the good chiplets that are not shaded. This may be achieved with a transfer substrate 200 as shown in FIG. 2 that can selectively pick up just the subset 101a from the donor substrate 100 once they are identified. As shown in FIG. 2, the transfer substrate 202 subsequently picks up a second set of chiplets 200 (e.g., from a different donor substrate). The locations of the chiplets within the set 200 correspond to the locations of the vacancies on the target substrate 102 (which, in turn, correspond to the locations of the defective chiplets on the first donor substrate 100). The transfer substrate 202 moves this set 200 to the target substrate 102, resulting in a full set 201 of operational chiplets being located on the target substrate 102.

The present disclosure relates to, among other things, a transfer substrate with a set of transfer elements (e.g., transfer pixels) that can selectively hold a subset of micro objects. Thus, even when all of the transfer elements are in contact with an array of micro objects that is greater than the subset, only the subset will be adhere and be transferred, and the objects outside the subset will be left behind or otherwise unaffected. Similarly, the transfer substrate may be able to selectively release a subset of micro objects that are currently attached to the substrate, such that only the subset is transferred to a target even all of the transfer elements are currently holding a micro object. This process is repeatable and reversible, such that no permanent bonding is need to affect the selective holding or releasing of the objects.

Figure 3:
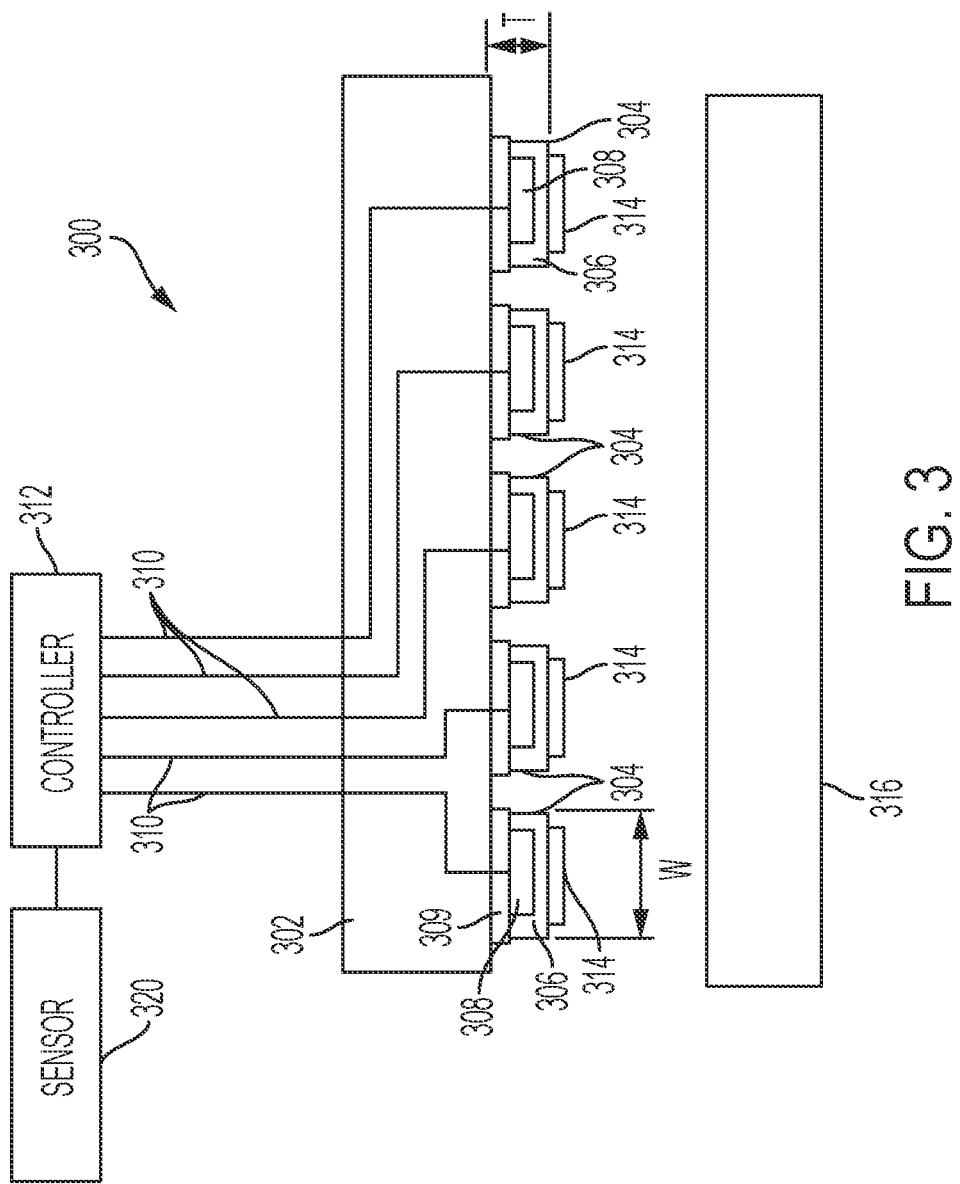
FIG. 3 is a side view of an apparatus according to an example embodiment.

In FIG. 3, a side view illustrates details of a mass-transfer apparatus 300 according to an example embodiment. The apparatus includes a transfer substrate 302 with two or more transfer elements 304. Each of the transfer elements 304 includes an adhesion element 306 having a first surface adhesion at a first temperature and a second surface adhesion at a second temperature. The second surface adhesion is less than the first surface adhesion. Each of the transfer elements 304 also includes a thermal element 308 operable to change a temperature of the adhesion element 306 in response to an input, e.g., via inputs 310. A controller 312 is coupled to provide the inputs 310 to the thermal elements 308, thereby causing a subset of the transfer elements 304 to selectably pick up and hold objects 314 to and (optionally) release the objects 314 from the transfer substrate 302. In particular, the objects 314 will not stick to the transfer elements 304 at the second surface adhesion but will stick at the first surface adhesion.

The apparatus 300 may be part of a micro-transfer system, which is a system used to transfer micro-objects (e.g., 1 μm to 1 mm) from the transfer substrate 302 to a target substrate 316. The adhesion element 306 may be formed of a multi-polymer that contains stearyl acrylate-based (SA). In such a case, a difference between the first and second temperatures may be less than 20° C. in order to adjust the tackiness of the adhesion element 306 such that there is a marked difference in surface adhesion.

The thermal element 308 may include one or both of a heating element and a cooling element. The inputs 310 may include electrical signals and/or laser light. The inputs 310 may be configured (e.g., using a matrix circuit) such that there are fewer lines going to the controller 312 than the total number of transfer elements 304. The transfer elements 304 may further include a thermal insulator 309 between the adhesion element 306 and the transfer substrate 302. The insulator 309 helps prevent heat transfer to the substrate 302, thereby decreasing the amount of energy needed to affect temperature change at the adhesion element 306 and decrease response time. For additional details of the micro-transfer apparatus and variations thereof, see commonly owned U.S. patent application Ser. No. 16/449,844, filed Jun. 24, 2019, the contents of which are hereby incorporated by reference.

A problem with mass transfer is that the source wafer, due to manufacturing defects, will contain a fraction of non-functional chips. Technology exists to identify these chips and skip them during transfer; however, this leaves a "more-or-less random" (usually including both a random component and a more systematic component that is an artifact of the donor manufacturing process) pattern of vacancies on the display panel after the initial mass transfer. In other cases, even operational chips can sometimes fail to be picked up or may fall off in transit, also leaving vacancies. This disclosure describes systems and methods for efficiently repairing these vacancies.

Given one or several "target" device (e.g., display panels) with vacancies and an additional one or several "donor" wafer (e.g., epitaxial device wafers, or epiwafers), the task is to find a sequence of transfers that repair all vacancies on the targets in as few transfers as possible. The problem is non-trivial, because the donor wafers themselves contain some non-functional chips and, after the first transfer, also some vacancies. Therefore, filling in all vacancies on a target by simply lifting the corresponding locations from a donor may not always possible. It has been shown that the problem of selecting the optimal sequence of transfers is NP-hard.

In embodiments below, a computerized system identifies a set of "donors" and a set of "targets," and finds a way to repair missing chips in the targets using donors as a source of chips, in as few transfers as possible. Note that since the problem is NP-hard, finding the optimal number of transfers may be infeasible for large target substrates, and so algorithms can be used instead that find "reasonable" solutions most of the time. For purposes of this disclosure, these reasonable solutions may be referred to as optimal, in that they are locally optimal or the best solution that can be found within a given constraint. Performance can be tested, for example, by calculating the average number of transfers necessary to repair a target. Other costs associated with the transfers may also be jointly considered when determining performance, such as the amount of waste, power efficiency, etc.

Figure 4:
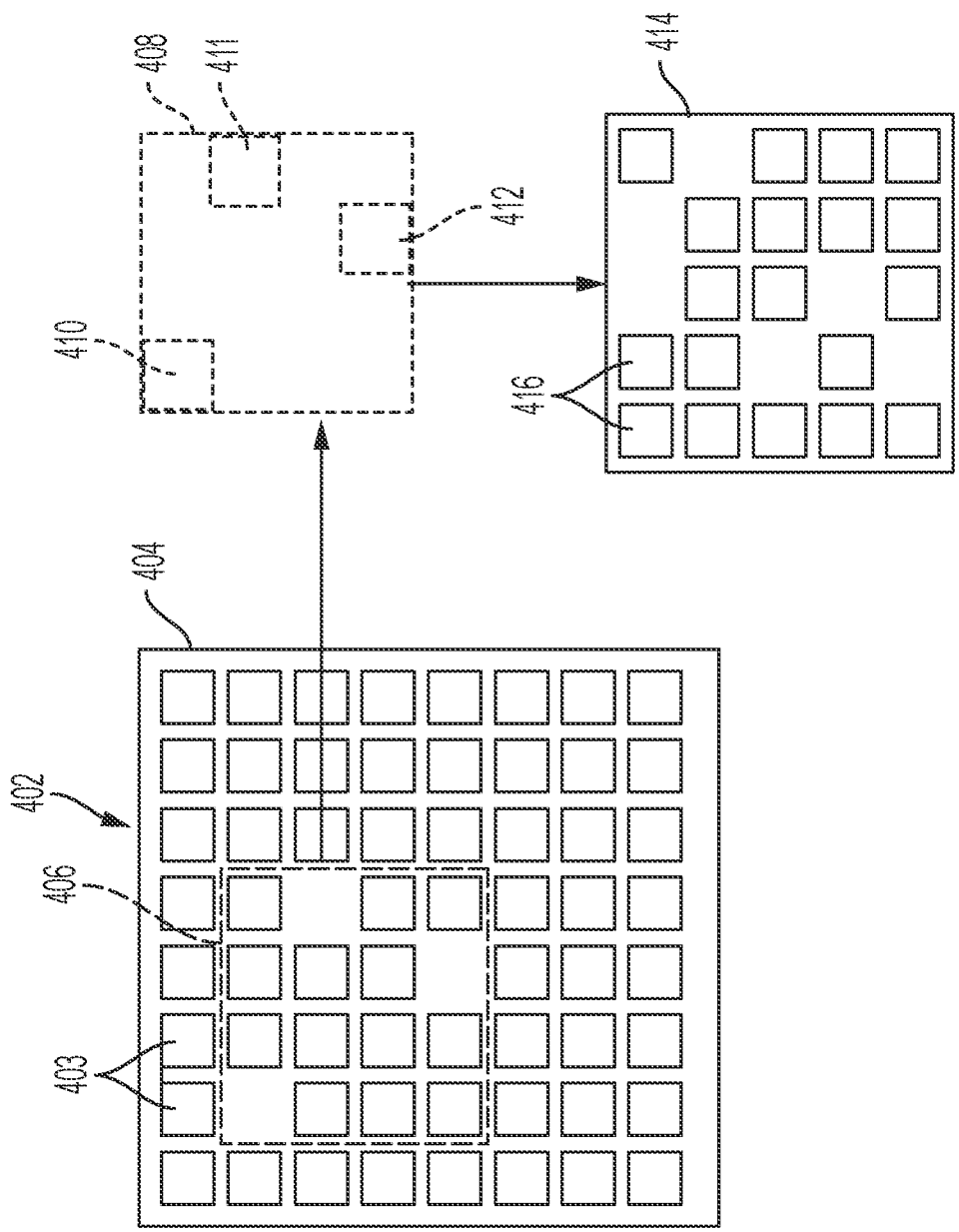
FIGS. 4 and 5 are diagrams illustrating the creation of a bounding box and an overlaying of the bounding box on a representation of a donor substrate.

The computer algorithms include several building blocks. The first building block is identifying all vacancies on a target that still need repair, and finding their bounding box. A diagram in FIG. 4 shows the definition of a bounding box 400 according to an example embodiment. A target device 402 includes an array of chips 403 on a carrier 404 with a plurality of vacancies. Note that the array need not be rectangular as shown, but could be circular, offset rectangles (e.g., brick wall pattern), honeycomb, etc. A bounding box 406 is defined that encompasses the vacancies on the target device 402. In this example, the bounding box 406 is axis-aligned. A representation 408 of the bounding box 406 is also defined, e.g., as data in memory of a computing system. The representation 408 at least includes symbolic/numeric data that represents the location of vacancies 410-412 within the bounding box representation 408.

Also seen in FIG. 4 is a representation 414 of donor coupon that is incompletely filled with functional chips 416. Note that the physical donor coupon may have more chips visible than seen in this representation 414, but those chips may have been found to be defective in testing, and so are treated as vacancies. Thus each square in the representation 414 corresponds to a functional chip 416, and areas where the squares are missing in the representation 414 are assumed to be non-functional chips or vacancies.

Figure 5:
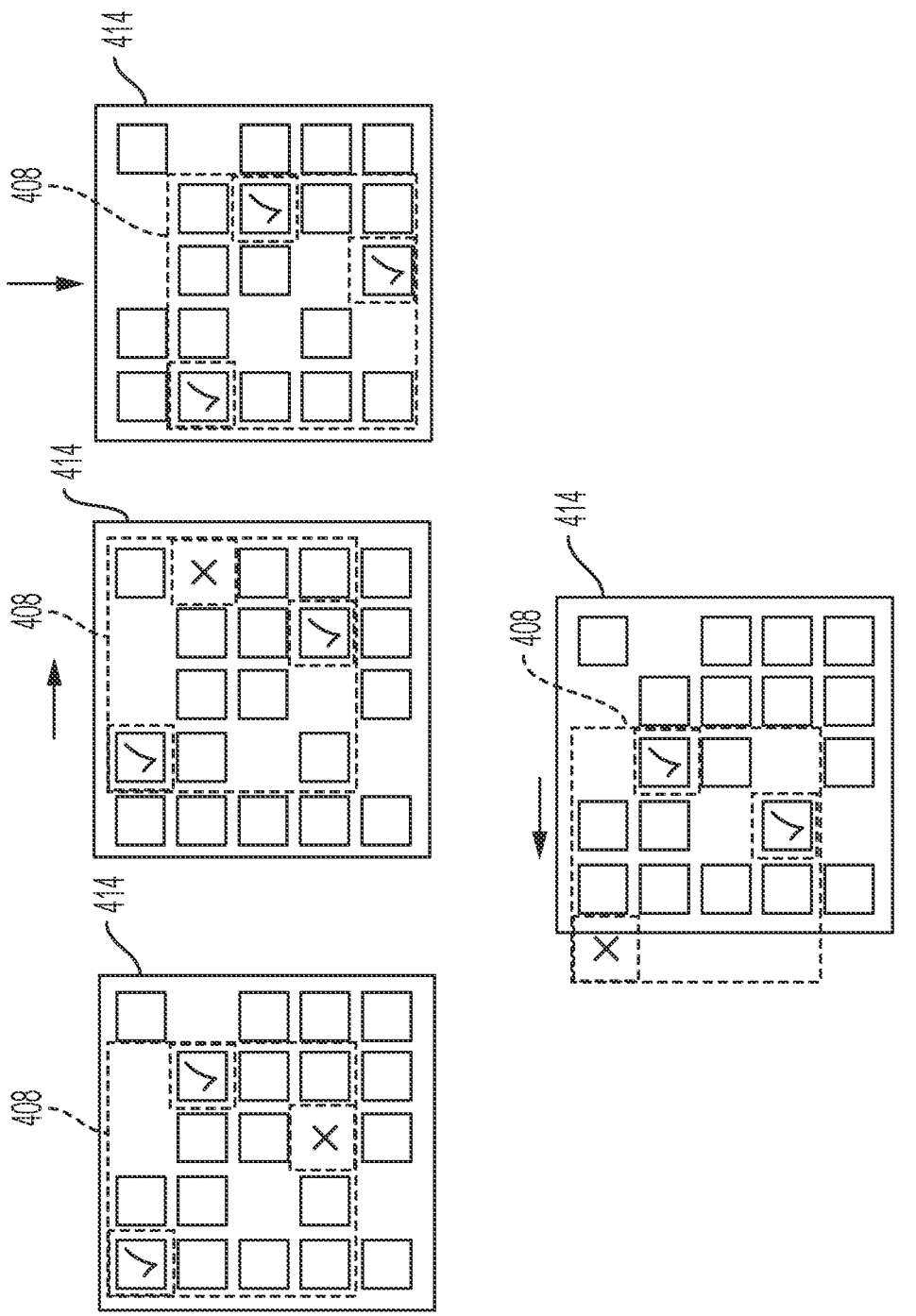

As seen in the diagram of FIG. 5, a method of finding matches between the bounding box representation 408 and the donor coupon registration 414 are shown according to an example embodiment. The representation 408 of the bounding box is shown placed over the representation 414 of the donor coupon at a plurality of translational offsets. On the top left side of FIG. 5, the upper left corner of the representations 408, 414 are aligned, resulting in two matches (check marks) and one miss (the letter 'x'). This will be referred to as the starting point of the search. At the top middle of FIG. 5, the representation 408 has been shifted to the right one unit from the starting point, which again results in two matches and one miss. At the top right of FIG. 5, the representation 408 has been shifted down one unit from the starting point, which results in a match between all of the vacancies of the target device 402 and corresponding ones of the functional chips on the donor coupon. Thus the offset shown in the right hand side of FIG. 5 can be used to repair the vacancies in the target device 402 in a single transfer operation.

In some embodiments described below, the representation 408 of the bounding box may be overlapped so that part of the bounding box representation 408 is outside the boundary of the representation 414 of the donor coupon. This case is shown at the bottom of FIG. 5, in which the leftmost column of the representation 408 of the bounding box is outside the boundary of the representation 414 of the donor coupon. Note that this offset results in two matches.

Sometimes the bounding box will be smaller than the target device, but if the edges of the target device have vacancies, the bounding box may be the same size as the target device. Note that in some embodiments the size of the bounding box may be limited to the size of the donor coupon, unless, for example, the transfer operation can span multiple coupons that are physically adjacent to one another.

The bounding box with vacancies is slid (e.g., a relative linear translation by discrete distances) over each of the donor coupons. Operations other than sliding may be possible, for example, rotations. The allowable rotations (e.g., 90°, 180°) may depend on factors such as symmetry of the chips (e.g., same or different width and height) and symmetry of the electrical connections on the mating side of the chips.

When sliding, the bounding box may be required to be fully contained within the donor, or the bounding box may be able to partially slide outside the area of the donor. If the target and the donor are the same size, the bounding box is the same size as the target and it is required to be fully contained within the donor, then there will be only one possible location to place the bounding box onto the donor, unless other operations such as rotations are allowed. In all other cases, there will be multiple possible locations at which the bounding box may be placed onto the donor.

At each of these possible locations, we evaluate the "match" of the pattern of vacancies to the donor. If a vacancy in the bounding box corresponds to a functional chip on the donor, then that vacancy can be repaired by lifting the chip from the donor and transferring it to the target. If a vacancy on the bounding box corresponds to a vacancy on the donor (because that donor location had already been used to repair another vacancy somewhere) or no a non-functional donor chip, then the vacancy cannot be repaired by transferring from that location. This allows for calculating the total number of remaining target vacancies, the number that can be repaired in this step, and the number of vacancies that cannot be repaired in this step.

Figure 6:
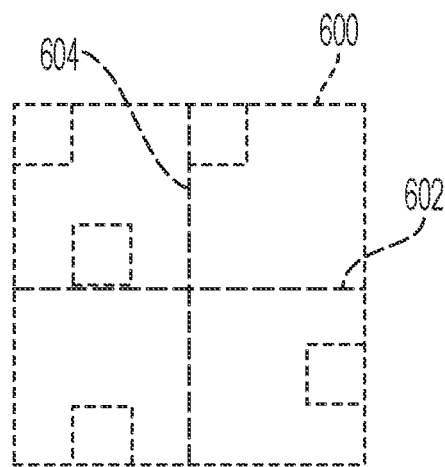
FIGS. 6-9 are diagrams illustrating subdividing of a bounding box according to example embodiments.
Figure 7:
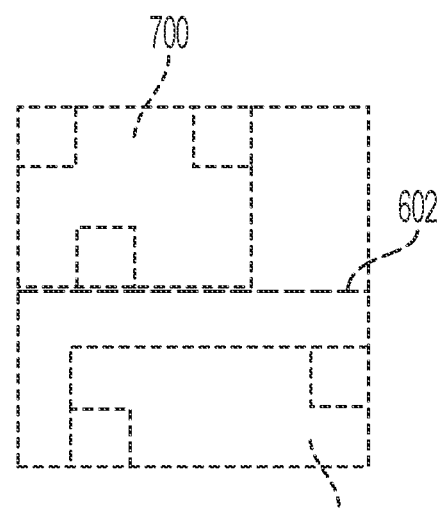
Figure 8:
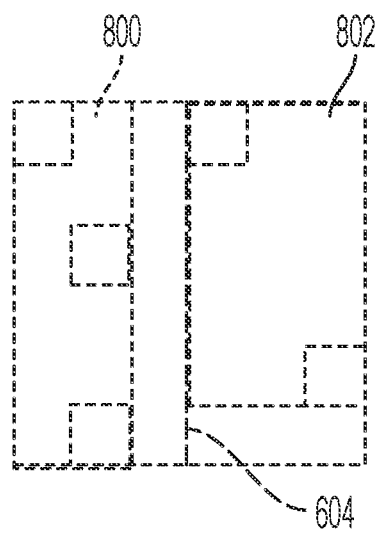
Figure 9:
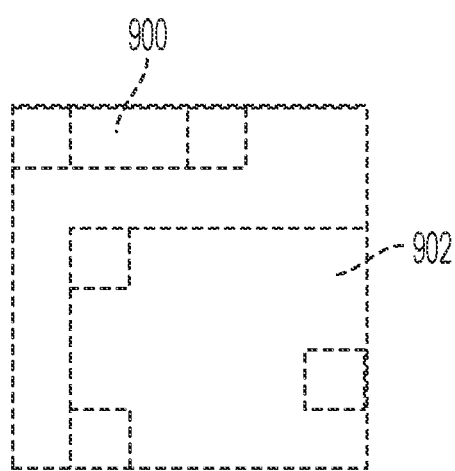

Another building block in a mass transfer algorithm is a "divide-and-conquer" operation, which is shown in FIGS. 6-9 according to example embodiments. In FIG. 6, a representation 600 of a target device is shown with five vacancies. In one embodiment, the target representation 600 can be subdivided in some predetermined way.

for example, into two equal side-by-side blocks using a horizontal line 602 across the middle. The resulting subdivided representations 700, 702 using this line 602 are shown in FIG. 7. Note that the subdivided representations 700, 702 in FIG. 7 and subsequent figures are shown being reduced to a minimum size that will still fit all of the vacancies within the subdivision. The sequence of repairs can then be constructed for each subdivisions 700, 702 separately In another embodiment, the target representation 600 can be subdivided using a vertical line 604 down the middle, with the resulting subdivisions 800, 802 shown in FIG. 8. In other embodiments, (not shown) the original target 600 can be divided into four quadrants, e.g., using both horizontal and vertical lines 602, 604. Note that for this simplified example, the resulting four-way subdivision would result in a single vacancy for three of the four quadrants, which would be considered a trivial solution that would not be considered a mass transfer. In another embodiment, instead of these fixed subdivisions, a more complex subdivision could be used (e.g. into non-rectangular blocks), or instead of using geometric patterns, the set of vacancies could be subdivided into arbitrary subsets using e.g. a machine learning algorithm. In FIG. 9, subdivisions 900, 902 are shown that may be determined in this way.

In addition, other sources of information could be used to decide how to subdivide vacancies into subdivisions. For example, if the manufacturing process causes a non-random distribution of defects (e.g. vertical streaks and horizontal streaks), then they could be subdivided into subdivisions according to defect type for easier packing. A pattern matching algorithm could be used to make these determinations. This could also be carried over to the selection of donor coupons. For example, one set of coupons could be favored for vertical streaks and another for horizontal streaks, thus ensuring that the chips are used more completely than if the same donor was used for both vertical and horizontal streaks.

Another set of considerations concerns the choosing of which of the donor locations to use for repairing a given bounding box, and which vacancies to repair. One of the options here include requiring that all vacancies in the bounding box are repairable in a single transfer from a single location. If that is not achieved at any donor coupon, then the bounding box can be broken into subdivisions recursively until the requirement is fulfilled. In this case, the results of the previous matching attempts may be used to decide how to divide the bounding box.

The results of the previous matching attempts can be tracked, for example, by forming a bit array for the ordered set of vacancies in the bounding box, e.g., [0000000000]. For each overlaying of the bounding box with the donor coupon, the bit is set to one if the vacancy matches a functional chip, and is set to zero if the vacancy matches another vacancy or a non-functional chip. So a full match at one bounding box location would result in [1111111111], and a match of just five of the vacancies at another bounding box location could be, for example, [0110110001]. This array could be compactly stored with other data, such as a coordinate of the donor coupon on which the upper left corner of the bounding box was located when the matching pattern was found. These could be sorted in storage by the sum of the bit array, such that the highest number of matches could be quickly identified. The bit arras could also allow identifying whether multiple instances of the same matching pattern were found, e.g., by converting the bit arrays to integers and comparing the integers.

For example, consider a bounding box with ten vacancies that is moved over one or more donor coupons. While none of the iterations resulted in all ten vacancies being matched, different groups of vacancies may be matched multiple times. For example, a first group of six vacancies [1011100010] may be matched at least once on one coupon and second group of four vacancies [0100011101] that are disjoint from the first group may be matched at least once on the same or different coupon. Having this knowledge, the system can subdivide the bounding box into the first and second group, and use the previously determined matches to perform the transfer. Note that some additional analysis may be required, e.g., to ensure that the first and second groups don't include the same chip on an individual donor coupon.

In other embodiments, if all of the vacancies in an initial bounding box find no matches, a donor location may be picked at which the maximum number of vacancies are repaired, and using it to repair those vacancies. In the previous example with ten vacancies, there may have been one location where seven of the ten vacancies can be replaced, and so these seven could be used for repair, with the three un-repairable vacancies being left over for subsequent transfers. Picking a sub-optimal location or repairing only a subset of vacancies that are repairable can be based on considerations such as packing to ensure fewer transfers for future repairs.

Another set of considerations concerns the control or scheduling of the operations mentioned above. Options here include a fixed schedule/control. One example of fixed control is to use the first donor position at which all vacancies in the current bounding box can be repaired. If no positions allow that, subdivide the bounding into a fixed number (e.g., two, four) of new bounding boxes using a grid and repeat the process recursively with each new bounding box. Another example of fixed control is to find the donor position at which the most vacancies can be repaired. Repair all those vacancies and repeat the process until no more vacancies remain.

Another control/scheduling operation includes adaptive or heuristic-based schedule/control. An example is to find the donor position at which the most vacancies can be repaired. If a threshold number (e.g., at least 80%) of vacancies can be repaired at that position, repair those. Otherwise, split the bounding box into subdivisions and recurse. The threshold and number of subdivisions may be adaptable based on factors such as the total number of vacancies, the ratio of functional to non-functional (or vacant) chips on the donor coupons, etc.

Another control/scheduling operation includes search-based control. For example, at each step, consider three options: (1) repairing the whole current bounding box; (2) splitting the bounding box vertically and repairing each half; (3) splitting the bounding horizontally and repairing each half. All three options could be tried (e.g., recursively) and the one that works best can be picked, or an approach such as A* search or greedy search could be used. At each step, the same three options as above may be considered, and used to train a neural network to look at the pattern of defects on the target and the donor and predict the best option to pick.

In order to create representations of the target device and the source coupons, a system may be configured with sensors (e.g., optical scanners) or other data that can be used to represent the chips and vacancies as data that can be stored in memory. For example, sensor 320 in FIG. 3 may be a camera or other optical sensor that can detect vacancies in the target substrate and/or vacancies or defective chips on the donor coupons. In one embodiment, a testing apparatus may assign a unique identifier to each donor coupon and perform a test to determine any defective or missing chips. This identifier can be marked on the coupon for automatic identification, e.g., a bar code, RFID tag, etc. If the chips are LEDs, for example, a voltage can applied either individually or to the whole coupon at once that cause the functional chips to illuminate. Any locations that fail to illuminate according to optical detector are considered defective, and the locations of those non-functional chips can be stored together with the coupon identifier in a database.

Later, as chips are removed from the coupon, the data associated with the coupon identifier is updated to indicate vacancies after each successful transfer operation. Similar data structures and data can be maintained on the target device.

Figure 10:
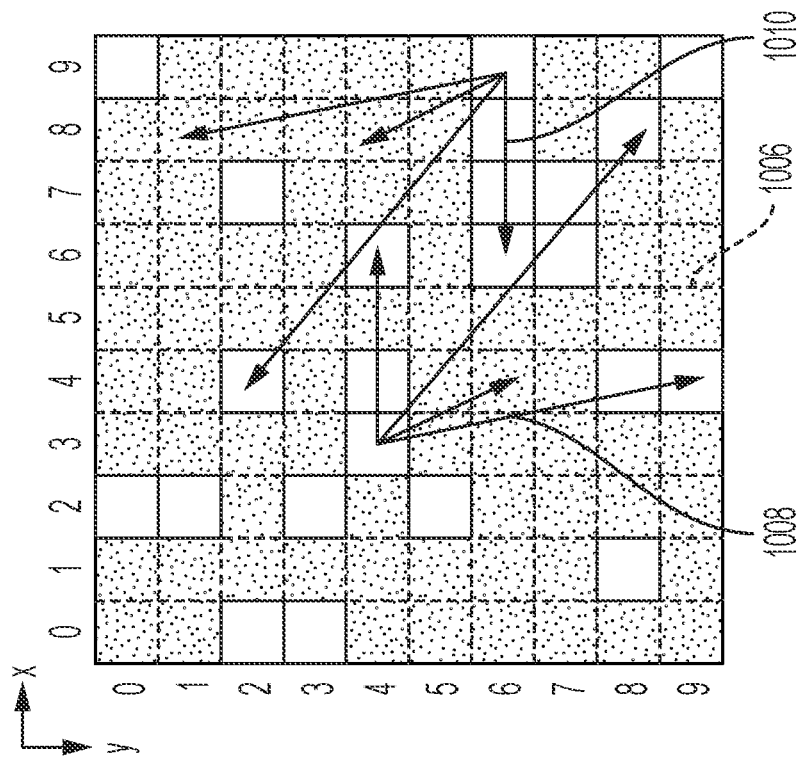
Figure 10:
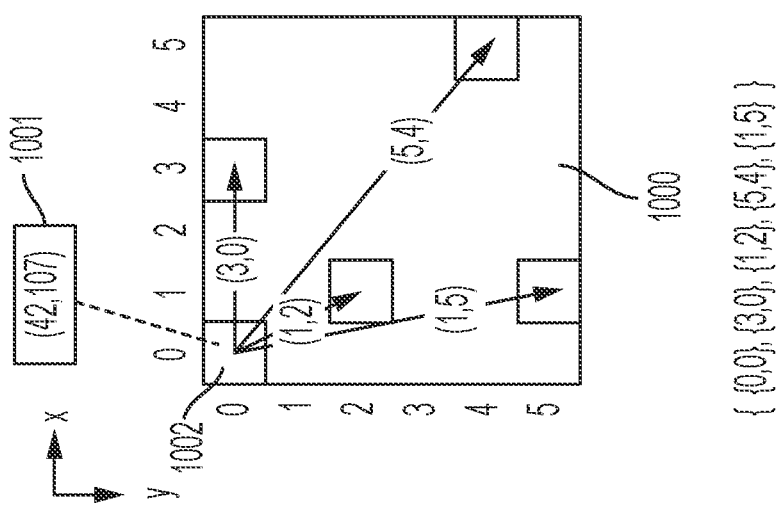

In FIG. 10, a diagram shows data used in representation 1000 of the bounding box and a representation 1006 of a donor coupon according to an example embodiment. Generally, the bounding box representation will 1000 include a size (5×5 in this example), and an indicator 1001 of where the bounding box is located within the target device. In this case, the indicator 1001 is a coordinate that references where the top left square 1002 of the bounding box representation 1000 is located in the target device. The top left square 1002 has local coordinate (0, 0) associated with the bounding box and has global coordinate (42, 107) being associated on the target device, e.g., a display panel.

Each square in the bounding box 1000 represents a vacancy in the target substrate. One of the squares, in this case the square at (0, 0) may be selected as a base square, and all of the other squares may be defined as offsets from the base square as indicated by the vectors shown in FIG. 10. Note there may not always be a square at local coordinate (0, 0), and any square could be selected as the base square. Also, other ways of representing the squares within the bounding box representation 1000 could be used, e.g., an ordered list of the local coordinates of each vacancy-indicating square.

As seen by the representation 1006 of the donor coupon, the search for matches could involve placing the base square at a location, and then looking at the offsets as indicated by the group 1008 of vectors that correspond the vectors shown in the bounding box representation 1000. Note that in some embodiments the base square may need only be placed at locations where there is a functional chip, which can reduce the number of calculations for sparse donor coupons, although may miss some matching patterns that don't include the base square. A second group 1010 of vectors is also shown, which are the same as the other group 1008 except rotated 180 degrees.

In FIG. 11, a diagram shows a data representation of the bounding box and donor coupon according to an example embodiment. The two-dimensional bit array B represents the bounding box 1000 in FIG. 10, where each '1' indicates a vacancy in the target device. The two-dimensional bit array D represents the donor coupon, where each '1' indicates the location of a functional chip. These arrays can be used to find matches as described above. For example, an element-wise logical AND of the array B with a sub-array of D that has the same size of B will result in the array B if there is a complete match. Note that for some algorithms, e.g., a machine learning algorithm described herein, a bounding box may not be used. In such a case, the entire target substrate, or a subdivision thereof, can be represented by a bit array similar to B, where a '1' in the array indicates a vacancy. Also note that the selection of '1' and '0' in these examples is arbitrary, and reverse representations may be used for binary values.

As an alternate, the array B may be decomposed into a data structure 1100, here shown as an array of two-dimensional coordinates that corresponds to the bounding box 1000. These coordinates could be local coordinates of each vacancy in the bounding box or an offset vector from one of the base squares, e.g., the first coordinate in the array. The overlapping algorithm could loop through each instance of '1' in array D and look at the value of the element of D for each offset from the base square defined in the array 1100. If this value is a '1', then a match is found. For each loop, a binary value representing the matches can be found, and optionally stored in a data structure (see variable 1102) depending on available memory and the size of the search domain. Note that this algorithm could also similarly traverse each element of D without considering whether or not the value corresponding to the location of the overlapping base square is '1' or '0.'

An example match variable 1102 is shown (the "0 B" indicates a binary value, such as the elements in a bit array). The value of this variable 1102 corresponds to the arrows 1008 in FIG. 10, in which four of the five vacancies are matched. Note that the array index of '9' for the variable indicates that the array D is traversed from top to bottom, left to right, such that the arrows 1008 in FIG. 10 originate from the ninth functional chip in this order. Also note that any functional chip of the donor coupon representation 1006 with an x-index greater than four may end up being skipped if the algorithm is primarily designed to look for complete matches. This is because placing the arrows 1008 to originate at coordinate (6, 4) on the representation 1006, for example, would result in the furthest arrow with local coordinate (5, 4) as seen at the left of the figure being off of the grid.

In some embodiments, the algorithm could do a more thorough scanning, such that cases could be considered where parts of the bounding box 1000 are outside the limits of the coupon representation 1006. This would lead to no matches for any vacancies that are off the grid, but could result in the other vacancies that are on the grid being fully matched. Another way to do this is to repeat the offset scanning overlay using different base squares within the bounding box. For example, the square in the bounding box 1000 at coordinate (1, 5) in FIG. 10 could be used as the base square in another iteration, such that a set of vectors would conceptually extend from this square to all other vacancies in the box. This could have the effect of capturing patterns in which the square at (0, 0) are not matched against the donor coupons, as those cases would not be considered assuming that the base square is only aligned with functional chip locations in the search. Finally, note that the algorithm could simply scan all locations within the donor coupon, rather than only those where a good chip matches a "base square" in the bounding box.

Figure 12:
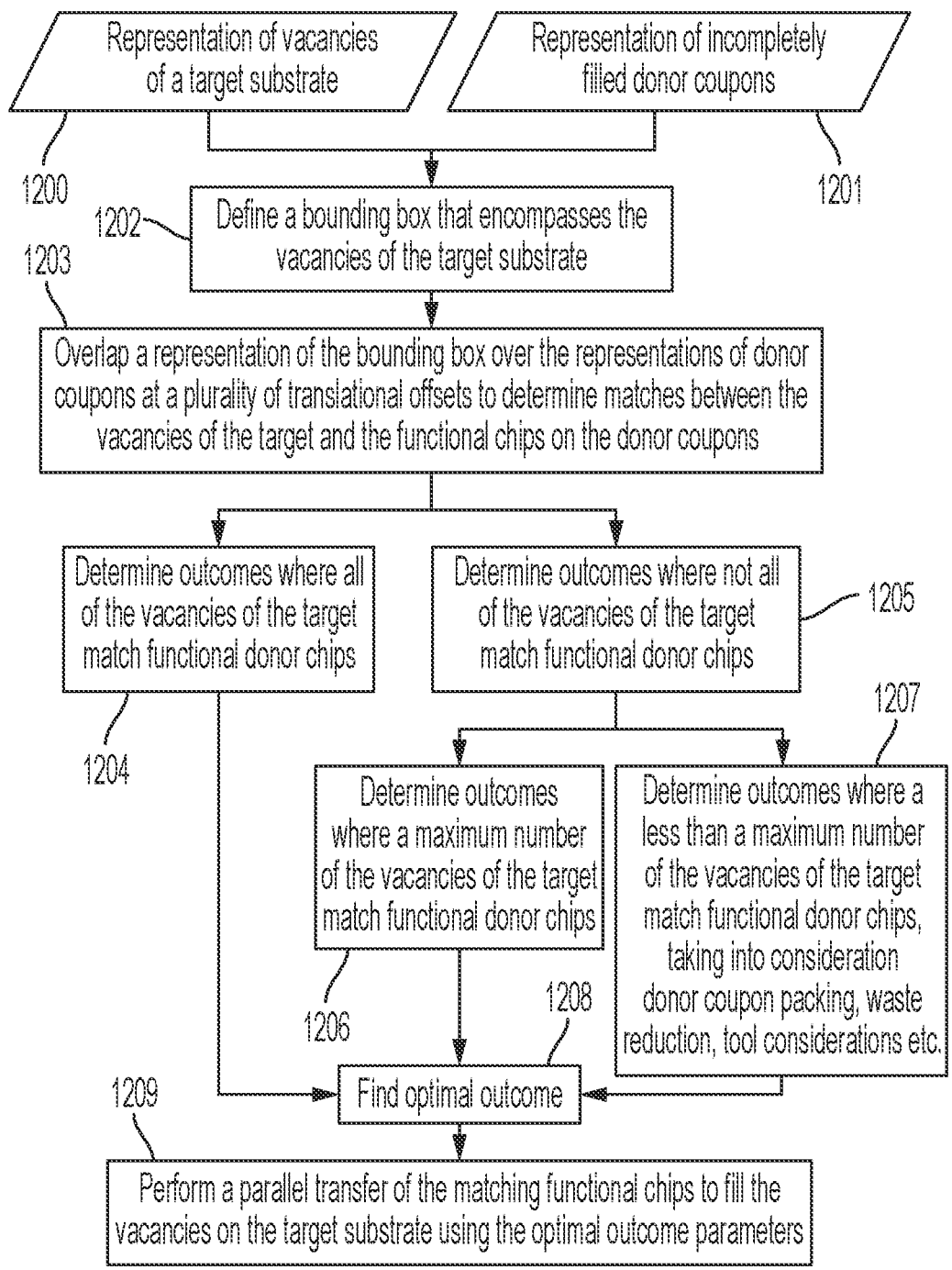
FIGS. 12-14 are flowcharts of methods according to example embodiments.

In FIG. 12, a flowchart illustrates a method according to an example embodiment. The method takes two inputs: a computer data representation 1200 of a target substrate comprising an array of chips on a carrier with a plurality of vacancies; and a computer data representation 1201 of donor coupons that are incompletely filled with functional chips. Using these representations, a bounding box is defined 1202 that encompasses the vacancies on the target substrate. The bounding box is also defined as a computer data representation. With this data, a plurality of outcomes are determined by overlapping 1203 a representation of the bounding box over a representation of each of a plurality of donor coupons at a plurality of translational offsets on a substrate plane to determine matches between the vacancies of the target and the functional chips on the donor coupons.

Blocks 1204-1207 represent possible outcomes that may be obtained with the overlapping and matching process described in block 1203. As seen at block 1204, one outcome could be that all of the vacancies of the target match functional donor chips. As seen at block 1205, another outcome could be that not all of the vacancies of the target match functional donor chips. There are at least two ways this could be dealt with, as shown in blocks 1206 and 1207. At block 1206, outcomes are determined where a maximum number of the vacancies of the target match functional donor chips. At block 1207, outcomes are determined where less than a maximum number of the vacancies of the target match functional donor chips.

Whether an outcome in block 1207 is optimal may take into consideration donor coupon packing, waste reduction, tool considerations etc. For example, while choosing less than a maximum number of matching chips may be suboptimal for a single transfer, it may reduce waste based on the pattern of functional chips remaining on the donor coupon. Such patterns may be known beforehand, e.g., attempt to preserve a maximum length of rows and columns, or may be determined through machine learning. As far as tool considerations, there may be a number of transfer heads (e.g., using transfer substrate 302 as shown in FIG. 3) that can be used, and in some cases smaller transfer heads can provide better performance (e.g., faster motion, less likelihood of missed transfers) than larger transfer heads, even if more transfers may be performed with the smaller heads.

Note that operations in blocks 1204-1207 may be performed in any combination of parallel or series operations. In one example of parallel operations, each different outcome could be determined for each offset. For serial operations, all of the outcomes in block 1204, for example, may be determined at the offsets, then outcomes for blocks 1205-1207 found similarly. A stopping criterion may be used for either parallel or serial determinations. For example, a score for each offset may be determined based on number of matches, transfer operations, and other considerations described above. If the score satisfies a threshold, then this may be considered sufficiently optimal as determined at block 1208.

A block 1208, an optimal one of the outcomes is found. As noted above, this may be a local optimum or a score that satisfies a threshold, and need not be globally optimal. Generally, the selected outcome will define at a selected one or more of the donor coupons and selected one or more offsets for each coupon. Note that this may include more than one offset for a single coupon, e.g., in cases where the transfer head can make two sequential chip removals from the same donor coupon at different offsets. If more than one donor coupon is selected in the outcome, then more than one offsets will also be selected, at least one for each selected donor coupon. The selected donor coupons and offsets can be used to define a series of transfer instructions input to a mass transfer apparatus to fill the vacancies on the target substrate.

The optimum outcome may be found by a search or optimization method (e.g., greedy search, A* search, depth first search, breadth-first search, etc.), where the method simulates performing a series of transfers and selects the step which minimizes the length of this series. Based on finding the desired outcome, a parallel transfer of the matching functional chips is performed 1209 to fill the vacancies on the target substrate using the selected donor coupon and selected offset. This may be performed using a system and apparatus as shown in FIG. 3. Note that the controller 312 may perform the method shown in FIG. 12, or the method may be performed by another computing apparatus that can transfer instructions to the controller 312.

Figure 13:
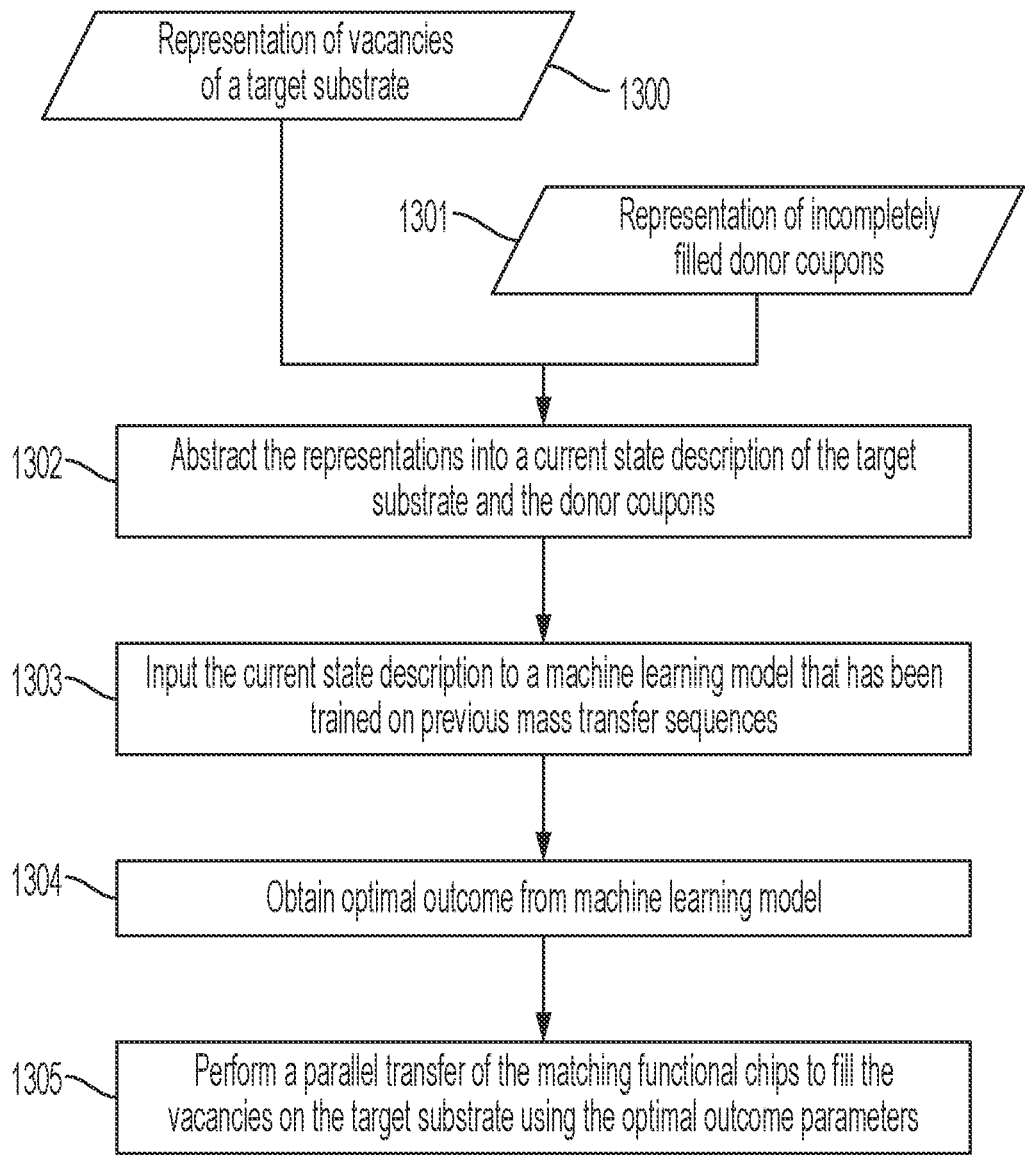

In FIG. 13, a flowchart illustrates a method according to another example embodiment. In this embodiment, the optimum outcome may be found by a machine learning model. Two inputs to the method are shown: a first data representation 1300 of a target substrate comprising an array of chips on a carrier with a plurality of vacancies; and a second data representation 1301 of donor coupons that are incompletely filled with functional chips. The algorithm creates 1302 an abstract description of the current state based on these representations. Note that the abstraction may expressed in different ways, e.g. the number of vacancies, features of the pattern of vacancies on the target substrate and on the donor coupons, etc. The abstraction may include other known data from the system, such as the highest number of vacancies that can be repaired in one step, cost as a function of number of steps, number of vacancies filled per step, costs of different available tooling, etc.

The representations in FIG. 11 are one example of abstracting the data suitable for input to a machine learning model. For example, the ones and zeros of the B and D arrays may be fed as-is to input nodes of a neural network or other machine learning model. These bit matrices may also or instead be transformed into bit arrays or other data structures that are fed to input nodes of a neural network or other machine learning model.

The current state description is input 1303 to a machine learning model that has been trained on previous mass transfer sequences. These sequences could be real-world data or simulations. The sequences need not be optimal, but may be associated with some sort of scoring so that the machine learning model can learn features of the better scoring sequences. This allows the machine learning model to use previous experience to determine the optimal step to take based on the features of the current state. Machine learning of this type can use a neural network, hidden Markov model, etc. The machine learning model may be trained to output the next operation to be performed, as in reinforcement learning framework, or it may be trained to answer a more narrowly defined question (for example, "at this step, is it better to subdivide the current bounding box horizontally or vertically?").

An optimal output is obtained 1304 from the machine learning model. The optimal output defines at least a selected one or more of the donor coupons and corresponding functional chips used to fill the vacancies. The selected donor coupons and offsets can be used to define a series of transfer instructions to fill the vacancies on the target substrate. Note that this output may not be locally or globally optimum, as such terms are used in search algorithms, but may be a highest-ranked outcome possible with the particular machine learning model being used. One of the reasons to use these machine learning models despite the output not necessarily being globally optimal is to make the algorithm efficient. As noted above, the problem is NP-hard, meaning that finding the global optimum may take impractically long in many cases of interest. A machine learning approach may provide an alternative that is very efficient in terms of running time, but can still incorporate a lot of domain knowledge and therefore produce solutions that are close to the global optimum. How close the solution is to a local or global optimum is based on factors such as the depth/complexity of the model, the quality of the training data set, the type of machine-learning model, etc. Based on finding the optimal outcome, a parallel transfer of the matching functional chips is performed 1305 to fill the vacancies on the target substrate using the selected donor coupon and corresponding functional chips. This may be performed using a system and apparatus as shown in FIG. 3. Note that the controller 312 may perform the method shown in FIG. 13, or the method may be performed by another computing apparatus that can transfer instructions to the controller 312.

Figure 14:
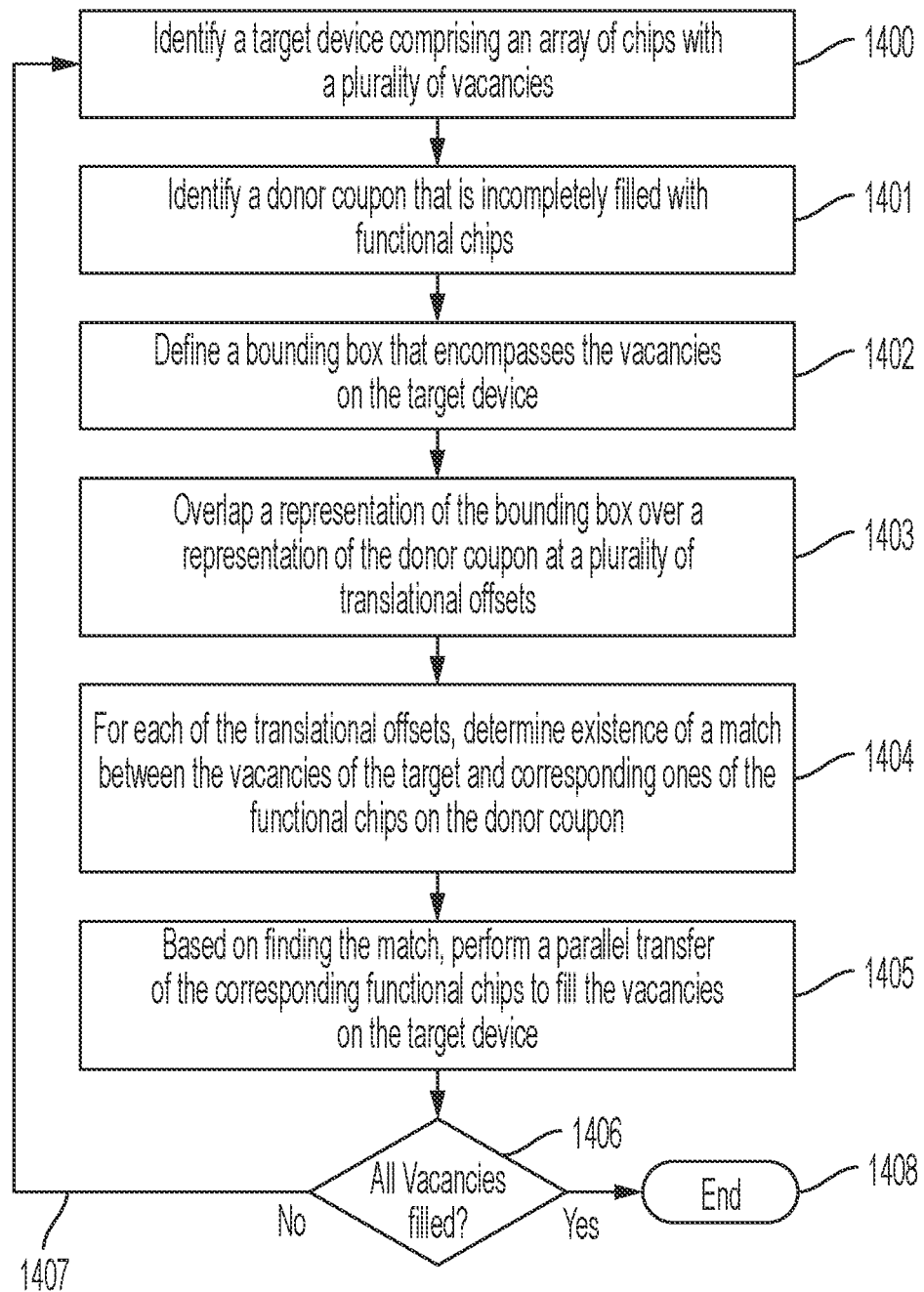

In FIG. 14, a diagram illustrates a method according to another example embodiment. The method involves identifying 1400 a target device comprising an array of chips with a plurality of vacancies. A donor coupon is identified 1401 that is incompletely filled with functional chips. A bounding box is defined 1402 that encompasses the vacancies on the target device. A representation of the bounding box is overlapped 1403 over a representation of the donor coupon at a plurality of translational offsets. For each of the translational offsets, the existence of a match determined 1404 between the vacancies of the target and corresponding ones of the functional chips on the donor coupon. Based on finding the match, a parallel transfer of the corresponding functional chips is performed 1405 to fill the vacancies on the target device. In one embodiment, the match might correspond to the donor coupon and the location within that donor coupon at which the maximum number of vacancies are fixed in one transfer.

If all of the vacancies are not filled by the transfer 1405 as determined at block 1406, then the method can be repeated for the remaining vacancies as indicated by path 1407. If all of the vacancies are filled, the block 1406 returns 'yes,' and the procedure ends 1408. Note that in a factory implementation, additional target devices may be continually added, such that the method continues to loop and look for vacancies even if the current target devices have no identified vacancies. Also note that the loop decision path 1406, 1407 may occur elsewhere. For example, this loop path 1406, 1407 could occur after block 1404, such that multiple transfers are identified and queued before being executed at block 1405.

As mentioned above, in some cases it will be desired to identify and fix vacancies on multiple target substrates using the same donor or a set of donors. This can be done using one of two approaches. In the sequential approach, one target substrate is picked and transfers are performed until all vacancies on that target are fixed. Subsequently, the next target substrate is picked and repaired, and so on. In the parallel approach, repair operations on all targets are interleaved. In this case, the operations described above are augmented with selecting not only the donor and the location on the donor from which to perform a mass transfer, but also selecting the identity of the target to which the current mass transfer will apply. This target identity may be selected using a fixed schedule (for example, cyclically going over all targets), an adaptive schedule (for example, selecting a target on which the maximum number of vacancies can be fixed in one step), or a machine learning approach. To accomplish this, the descriptions above should be modified in a manner apparent to those skilled in the art.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. A method, comprising:
    identifying a target substrate comprising an array of chips on a carrier with a plurality of vacancies;
    identifying a plurality of donor coupons that are incompletely filled with functional chips;
    defining a bounding box that encompasses the vacancies on the target substrate;
    simulating a plurality of outcomes by overlapping a representation of the bounding box over a representation of each of the plurality of donor coupons at a plurality of translational offsets on a substrate plane to determine matches between the vacancies of the target and the functional chips on the donor coupons;
    determining an optimal one of the outcomes at a selected one or more of the donor coupons corresponding one or more offsets; and
    performing a parallel transfer of the matching functional chips to fill the vacancies on the target substrate using the one or more selected donor coupons and corresponding one or more offsets.

2. The method of claim 1, wherein the plurality of outcomes comprise:
    first outcomes where all of the vacancies of the target match functional chips on the donor coupons; and
    second outcomes where not all of the vacancies of the target match functional chips on the donor coupons, wherein subsets of the vacancies on the target substrate are defined, wherein the overlapping and the determining of the match are performed with representations of the subsets of the vacancies.

3. The method of claim 2, wherein the subsets of vacancies are determined by defining smaller bounding boxes that are subdivisions of the bounding box, wherein the overlapping and the finding of the match are performed with representations of the smaller bounding boxes.

4. The method of claim 3, wherein the smaller bounding boxes comprise rectangular subdivisions of the bounding box.

5. The method of claim 3, wherein the smaller bounding boxes comprise irregular shapes that subdivide the bounding box.

6. The method of claim 3, wherein the smaller bounding boxes are defined adaptively based on one or more of patterns of partial matches during the overlapping; a pattern of the vacancies on the target relative to pattern of unusable locations the donor coupons; and a size and shape of a current bounding box.

7. A system comprising a processor coupled to a mass transfer apparatus that are configured to perform the method of claim 1.

8. A method, comprising:
    identifying a target substrate comprising an array of chips on a carrier with a plurality of vacancies;
    identifying a donor coupon that is incompletely filled with functional chips;
    defining a bounding box that encompasses the vacancies on the target substrate;
    overlapping a representation of the bounding box over a representation of the donor coupons at a plurality of translational offsets on a substrate plane;
    for each of the offsets, determining existence of a match between the vacancies of the target and the functional chips on the donor coupon; and
    based on finding the match, performing a parallel transfer of the matching functional chips to fill the vacancies on the target substrate.

9. The method of claim 8, wherein the overlapping further comprises rotating the representation of the bounding box over the representation of the donor coupon at two or more different angles for at least one of offsets.

10. The method of claim 8, further comprising, if no match is found, defining subsets of the vacancies on the target substrate, wherein the overlapping and the finding of the match are performed with representations of the subsets.

11. The method of claim 10, wherein the subsets of vacancies are determined by defining smaller bounding boxes that are subdivisions of the bounding box, wherein the overlapping and the finding of the match are performed with representations of the smaller bounding boxes.

12. The method of claim 11, wherein the smaller bounding boxes comprise rectangular subdivisions of the bounding box.

13. The method of claim 11, wherein the smaller bounding boxes comprise irregular shapes that subdivide the bounding box.

14. The method of claim 11, wherein the smaller bounding boxes are defined adaptively based on one or more of patterns of partial matches during the overlapping; a pattern of the vacancies on the target relative to a pattern of unusable locations the donor coupons; and a size and shape of a current bounding box.

15. The method of claim 8, further comprising, if all of the vacancies of the target are not matched with the functional chips on the donor coupon for all of the offsets:
  finding a calculated offset which optimizes a size of a subset of the vacancies that match a subset of the functional chips on the donor coupon;
  performing the parallel transfer of the subset of the functional chips to fill the subset of the vacancies on the target substrate; and
  repeating the method on remaining vacancies that are not in the subset.

16. A computer-readable medium comprising instructions executable by a processor, the instruction causing the processor to perform the method of claim 8.

17. A system comprising a processor coupled to a mass transfer apparatus that are configured to perform the method of claim 8.

* * * * *